United States Patent
Murakami et al.

(10) Patent No.: US 7,851,337 B2
(45) Date of Patent: Dec. 14, 2010

(54) METHOD FOR PRODUCING SEMICONDUCTOR SUBSTRATE

(75) Inventors: Satoshi Murakami, Tokyo (JP); Nobuyuki Morimoto, Tokyo (JP); Hideki Nishihata, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 100 days.

(21) Appl. No.: 11/801,461

(22) Filed: May 9, 2007

(65) Prior Publication Data
US 2007/0264797 A1 Nov. 15, 2007

(30) Foreign Application Priority Data
May 9, 2006 (JP) .............................. 2006-130237

(51) Int. Cl.
- H01L 21/00 (2006.01)
- H01L 21/30 (2006.01)
- H01L 21/46 (2006.01)
- H01L 21/425 (2006.01)

(52) U.S. Cl. ....................... 438/480; 438/458; 438/514; 257/E21.122

(58) Field of Classification Search ................. 438/458, 438/471, 473, 474, 475, 476, 480, 514, 515, 438/526, 527; 257/E21.122
See application file for complete search history.

(56) References Cited

U.S. PATENT DOCUMENTS

| 5,953,622 A * | 9/1999 | Lee et al. ..................... 438/458 |
| 6,344,404 B1 * | 2/2002 | Cheung et al. .............. 438/513 |
| 2006/0063353 A1 | 3/2006 | Akatsu |

FOREIGN PATENT DOCUMENTS

| CN | 1227964 A | 9/1999 |
| WO | 2005093807 A1 | 10/2005 |

OTHER PUBLICATIONS

Chinese Office Action dated Jun. 27, 2008 (with English Translation).

* cited by examiner

*Primary Examiner*—Alexander G Ghyka
*Assistant Examiner*—Seahvosh J Nikmanesh
(74) *Attorney, Agent, or Firm*—Sughrue Mion, PLLC (57) ABSTRACT

There is provided a method for suppressing the occurrence of defects such as voids or blisters even in the laminated wafer having no oxide film wherein hydrogen ions are implanted into a wafer for active layer having no oxide film on its surface to form a hydrogen ion implanted layer, and ions other than hydrogen are implanted up to a position that a depth from the surface side the hydrogen ion implantation is shallower than the hydrogen ion implanted layer, and the wafer for active layer is laminated onto a wafer for support substrate, and then the wafer for active layer is exfoliated at the hydrogen ion implanted layer.

3 Claims, 7 Drawing Sheets

PRIOR ART

METHOD FOR PRODUCING SEMICONDUCTOR SUBSTRATE

BACKGROUND OF THE INVENTION

1. Technical Field

This invention relates to a method for producing a semiconductor substrate, and more particularly to a method for producing a semiconductor substrate through a lamination process of directly laminating silicon wafers to each other without using an oxide film.

2. Related Art

Recently, semiconductor substrates having such a SOI structure that a silicon layer or a so-called SOI layer is formed on an oxide film are applied as a wafer for high-performance LSI in electron devices because they are adaptable for the speeding-up of the device and are low in the consumption power and excellent in the pressure resistance, environment resistance and the like. Particularly, it is demanded to produce SOI wafer having a higher quality in association with a higher integration of semiconductor device, and hence it is increasingly requested to form a laminated wafer by thinning a buried oxide film, for example, up to a thickness of about 20 nm as compared with the conventional ones or by directly laminating silicon wafers to each other without using the oxide film.

As to the semiconductor substrate of SOI structure, there are known a so-called SIMOX method wherein oxygen ions are implanted into a silicon wafer at a high concentration and then subjected to a heat treatment at a higher temperature to form an oxide film in its interior, and a method called as a lamination process. In this lamination process, an oxide film is formed on at least one of a wafer for an active layer forming SOI layer and a wafer for a support substrate turning a support substrate and the wafer for the active layer is laminated onto the wafer for the substrate through the oxide film and thereafter the wafer for the active layer is thinned to produce a semiconductor substrate wherein SOI layer is formed on the buried oxide film as an insulating film.

Further, the lamination process can be classified into a grinding and polishing process, a PACE (plasma assisted chemical etching) process, an ion implantation exfoliation process (which is also called as Smart Cut (registered trademark) process), an ELTRAN process and the like. Among them, the ion implantation exfoliation process is frequently used in view of advantageous points that the crystallinity of the active layer is good, the uniformity of the thickness of the active layer is good, the flatness of the surface is good and the like.

Figure 1:
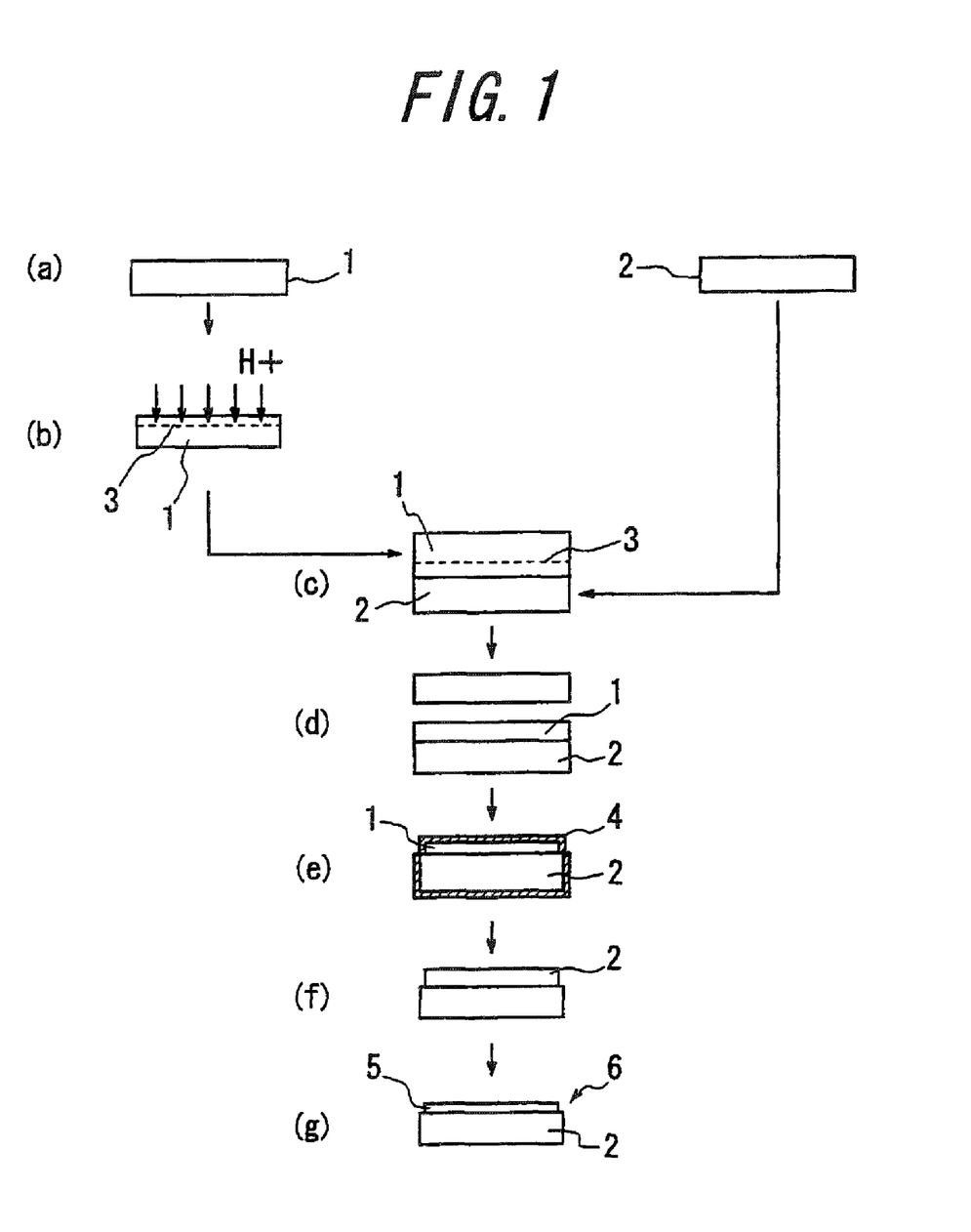
FIG. 1 is a flow chart showing procedures of producing a semiconductor substrate by the conventional lamination process.

The production procedure of the semiconductor substrate through the ion implantation exfoliation process is shown in FIG. 1 with respect to a case that silicon wafers are directly laminated to each other without using an oxide film. That is, a wafer 1 for an active layer and a wafer 2 for a support substrate are previously provided (step (a)), and hydrogen ions (or inert gas ions) are implanted into at least one of these wafers (the wafer 1 for the active layer in the illustrated embodiment) to form an ion implanted layer 3 in the interior of the wafer 1 for the active layer (step (b)). Next, the ion implanted face of the wafer 1 for the active layer is laminated onto the wafer 2 for the support substrate (step (c)) and thereafter subjected to an exfoliation heat treatment to partly exfoliate the wafer 1 for the active layer using the ion implanted layer 3 as a cleavage plane (exfoliation face) (step (d)), and thereafter an oxidation treatment is again conducted for removing a damaged layer formed on the surface of the active layer (step (e)), and a step (f) of removing the resulting oxide film 4 is conducted and a planarization treatment is conducted to produce a semiconductor substrate 6 in which a silicon layer 5 is formed on the wafer 2 for the support substrate (step (g)).

In the production of the laminated wafer through the ion implantation exfoliation process, the preparation of the wafer without forming the oxide film is conducted by laminating the wafer for the active layer and the wafer for the support substrate to each other without forming the oxide film on both the wafers.

However, when the wafer is prepared without forming the buried oxide film, if the exfoliation heat treatment is carried out after the lamination of the wafers, blisters or voids are generated between the wafer for the support substrate and the wafer for the active layer.

That is, when the semiconductor substrate is prepared by the conventional lamination process, defects such as voids, blisters may be generated on the laminated interface. These void or blister defects tend to be frequently generated as the thickness of the buried oxide film existing between the two semiconductor substrates becomes thinner and particularly come into a serious problem in the production of the laminated semiconductor wafer having no oxide film.

Since the voids or blisters are frequently generated as the thickness of the buried oxide film existing between the two semiconductor wafers become thin, JP-A-2004-259970 proposes a countermeasure that the thickness of the wafer for the active layer is increased to increase the thickness of the active layer and raise the hardness of the active layer.

However, as the film thinning is proceeding with respect to the active layer, the thickening of the thickness of the active layer for raising the hardness at a midway step requires labor in the subsequent work for the film thinning and results in the deterioration of the quality. That is, when the thickness of the active layer is thick at the midway step, in order to obtain a final thickness of the active layer, it is required to reduce the thickness by thermal oxidation and removal of oxide film or by grinding or polishing work. As the working quantity (oxidation quantity, etching quantity, grinding or polishing quantity) increases, it is difficult to make the thickness of the active layer uniform.

SUMMARY OF THE INVENTION

It is, therefore, an object of the invention to provide a method for suppressing the occurrence of defects such as voids or blisters even in the laminated wafer having no oxide film.

The inventors have made various studies on the cause of frequently generating the defects such as void and blister in the production of the laminated wafer having no oxide film and discovered the followings.

That is, the voids or blisters are generated due to the fact that hydrogen ions implanted into the active layer are diffused into the laminated interface in the exfoliation heat treatment to form hydrogen gas which weaken the bonding strength between the wafer for the active layer and the wafer for the support substrate. When the oxide film formed in the wafer for the active layer is thick, since the implantation energy in the implantation of hydrogen ions is large, there is caused a phenomenon that the hydrogen ions sputter oxygen from the oxide film to implant oxygen into the active layer.

When the wafer for the active layer and the wafer for the support substrate are laminated and subjected to exfoliation heat treatment, it has newly been found that oxygen implanted into the active layer traps hydrogen ions to suppress the diffusion of hydrogen into the laminated interface and hence the occurrence of void or blister defects. Further, it has been found that as an adequate dose of oxygen is implanted into the active layer, the wafer for the active layer becomes hard and also contributes to suppress the occurrence of voids or blisters.

On the contrary, when the buried oxide film is not formed, oxygen sputtered by the implantation of hydrogen ions and implanted into the active layer at the step (b) is substantially vanished, and hence the diffusion of hydrogen in the exfoliation heat treatment can not be prevented and the void or blister defects are generated.

Based on the above discovery, various examinations are conducted on methods capable of implanting an adequate dose of oxygen or other element into the active layer even in case of not forming the oxide film.

At first, the inventors introduced the following equation (I) in the examination on the above effect of suppressing the hydrogen diffusion by oxygen every factor:

$$N_D = N_{HO} + N_{IO} + N_{ID} \quad (I)$$

where $N_D$: total factor number producing the effect of suppressing hydrogen diffusion, $N_{HO}$: oxygen introduced into active layer through hydrogen ion implantation, $N_{IO}$: oxygen introduced into active layer through ion implantation other than hydrogen, $N_{ID}$: defects introduced into active layer through ion implantation other than hydrogen.

Based on the above equation (I), the inventors have made various cases and sought optimum conditions for avoiding the defects in case of no oxide film.

Firstly, when hydrogen ions are implanted at an implantation energy: 50 keV and a dose: $6 \times 10^{16}$ atoms/cm$^2$ into a wafer for an active layer having an oxide film of usual thickness: 150 nm as the conventional method, a good product having no defect is $N_{HO} = 4.2 \times 10^{14}$ atoms/cm$^2$ from data of a secondary ion mass spectrometry (SIMS). Also, since ion other than hydrogen is not implanted, $N_{IO} + N_{ID} = 0$, so that it is sufficient to be $N_D > 4.2 \times 10^{14}$ atoms/cm$^2$.

Then, it is considered that the condition for obtaining the good product only by the hydrogen ion implantation is satisfied when the oxide film is not existent.

When the condition is $N_{HO} = D_H$ (hydrogen dose)$\times t_{box}$ (thickness of oxide film)$\times K_{HO}$ (coefficient) ... (II), $N_{HO} = 0$.

Therefore, it has been found that in order to satisfy $N_D > 4.2 \times 10^{14}$ atoms/cm$^2$, it is required to take some alternative means for developing the above action of oxygen, which is not served by the hydrogen ion implantation, by implanting ions other than hydrogen, and as a result the invention has been accomplished.

That is, the summary of the invention is as follows.

(1) A method for producing a semiconductor substrate, which comprises the steps of implanting hydrogen ions into a wafer for an active layer having no oxide film on its surface to form a hydrogen ion implanted layer, implanting ions other than hydrogen up to a position that a depth from the surface side the hydrogen ion implantation is shallower than the hydrogen ion implanted layer, laminating the wafer for the active layer at the ion implanted side to a wafer for a support substrate, and then exfoliating the wafer for the active layer at the hydrogen ion implanted layer (first invention).

(2) A method for producing a semiconductor substrate, which comprises the steps of implanting ions other than hydrogen into a wafer for an active layer having no oxide film on its surface up to a position shallower than an exfoliation region of the wafer for the active layer, implanting hydrogen ions into the exfoliation region to form a hydrogen ion implanted layer, laminating the wafer for the active layer at the ion implanted side to a wafer for a support substrate, and then exfoliating the wafer for the active layer at the hydrogen ion implanted layer (second invention).

(3) A method for producing a semiconductor substrate, which comprises the steps of forming an oxide film on a wafer for an active layer, implanting hydrogen ions into the wafer for the active layer to form a hydrogen ion implanted layer, implanting ions other than hydrogen up to a position that a depth from the surface side the hydrogen ion implantation is shallower than the hydrogen ion implanted layer, removing the oxide film from the wafer for the active layer, laminating the wafer for the active layer at the ion implanted side to a wafer for a support substrate, and then exfoliating the wafer for the active layer at the hydrogen ion implanted layer (third invention).

(4) A method for producing a semiconductor substrate, which comprises the steps of forming an oxide film on a wafer for an active layer, implanting ions other than hydrogen into a wafer for an active layer having no oxide film on its surface up to a position shallower than an exfoliation region of the wafer for the active layer, implanting hydrogen ions into the exfoliation region to form a hydrogen ion implanted layer, removing the oxide film from the wafer for the active layer, laminating the wafer for the active layer at the ion implanted side to a wafer for a support substrate, and then exfoliating the wafer for the active layer at the hydrogen ion implanted layer (fourth invention).

(5) A method for producing a semiconductor substrate according to any one of items (1)-(4), wherein a plasma treatment is carried out prior to the lamination of the wafer for the active layer and the wafer for the support substrate.

According to the invention, the semiconductor substrate formed by directly silicon wafers to each other without using the oxide film can be produced under a stable quality without causing void or blister defects.

DESCRIPTION OF THE PREFERRED EMBODIMENTS

The invention lies in that when a semiconductor substrate is produced by directly silicon wafers to each other without using an oxide film, ions other than hydrogen ions implanted for exfoliating the wafer for the active layer is implanted in a dose enough to suppress hydrogen ion diffusion in thermal exfoliation, and concrete methods therefor are explained individually.

Figure 2:
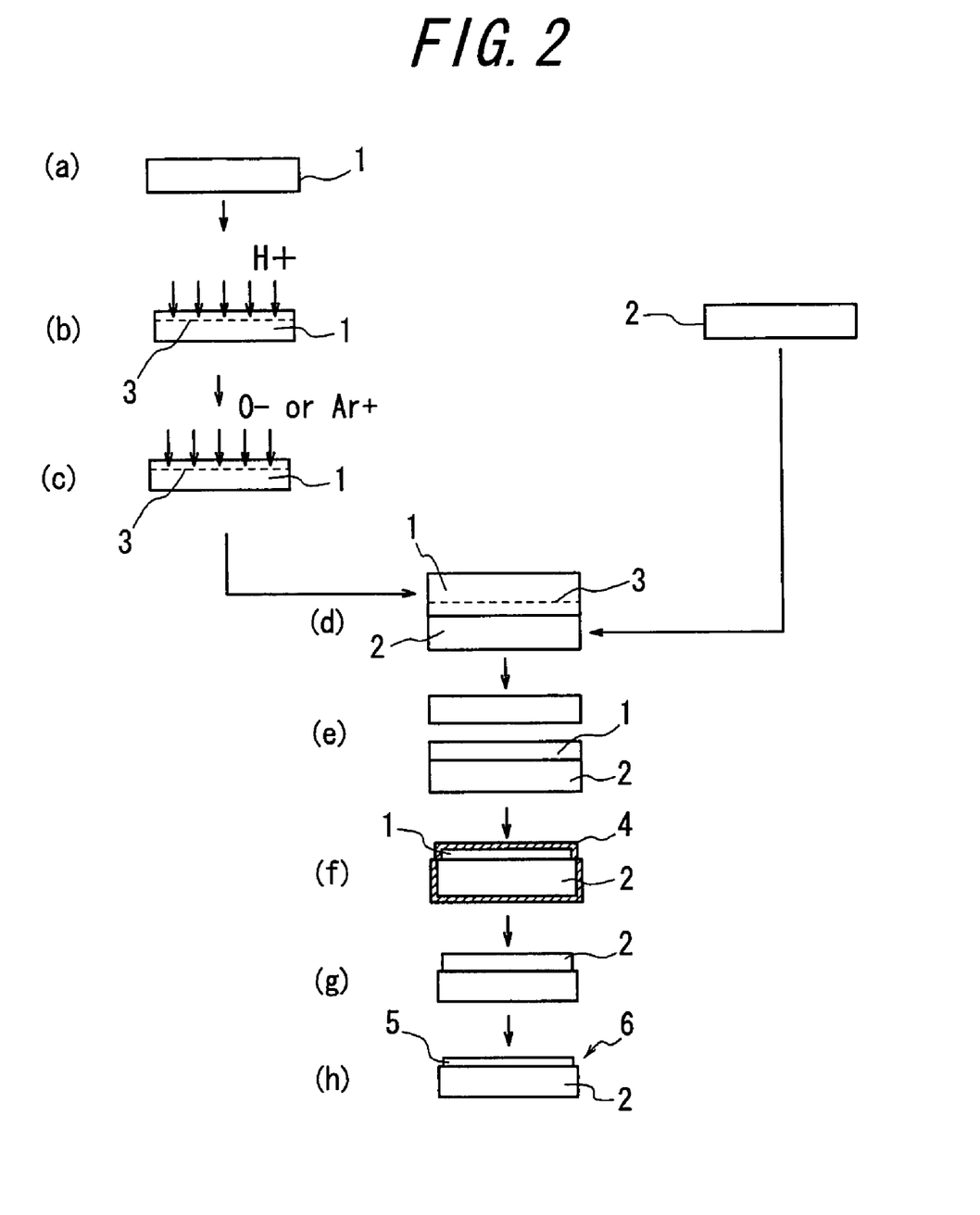
FIG. 2 is a flow chart showing procedures of producing a semiconductor substrate according to the invention.

In the method according to the first invention shown in FIG. 2, a wafer 1 for an active layer and a wafer 2 for a support substrate are previously provided (step (a)). Firstly, hydrogen ions are implanted into the wafer 1 for the active layer without forming an oxide film to form an ion implanted layer 3 in the interior of the wafer 1 for the active layer (step (b)).

Thereafter, ions other than hydrogen such as oxygen ions or argon ions are implanted up to a position that a depth from the surface side the hydrogen ion implantation is shallower than the hydrogen ion implanted layer 3 (step (c)). By the implantation of the oxygen ions or argon ions are implanted a dose of ions sufficient to suppress the occurrence of void or blister defects in the active layer.

Then, the wafer 1 for the active layer is laminated at the ion implanted side to the wafer 2 for the support substrate (step (d)), and an exfoliation heat treatment is applied to partly exfoliate the wafer 1 for the active layer at the ion implanted layer 3 as a cleavage plane (exfoliation face) (step (e)), and thereafter the re-oxidation treatment (step (f)), removal of oxide film 4 (step (g)) and planarization treatment (step (h)) are carried out to produce a semiconductor substrate 6 in which a silicon layer 5 is formed on the wafer 2 for the support substrate.

As the planarization treatment is suitable a treatment in Ar or $H_2$ atmosphere at a high temperature above 1100° C.

In the above method, the ions other than hydrogen are particularly implanted at the step (c), so that the diffusion of hydrogen into the laminated interface at the exfoliation heat treatment of the step (e) is suppressed by such implanted ions to suppress the occurrence of voids or blisters, and hence the semiconductor substrate is obtained by directly laminating silicon wafers to each other without using the oxide film.

The condition for implanting the ions other than hydrogen required for the suppression of void or blister defects in the active layer is explained in detail below.

That is, the dose of the ions other than hydrogen is derived from a relational equation to the thickness of the oxide film in the implantation as follows. Moreover, the upper limit can be determined experimentally, and is $1 \times 10^{16}$ atoms/cm$^2$ for argon ions and $2 \times 10^{16}$ atoms/cm$^2$ for oxygen ions, respectively.

Figure 3:
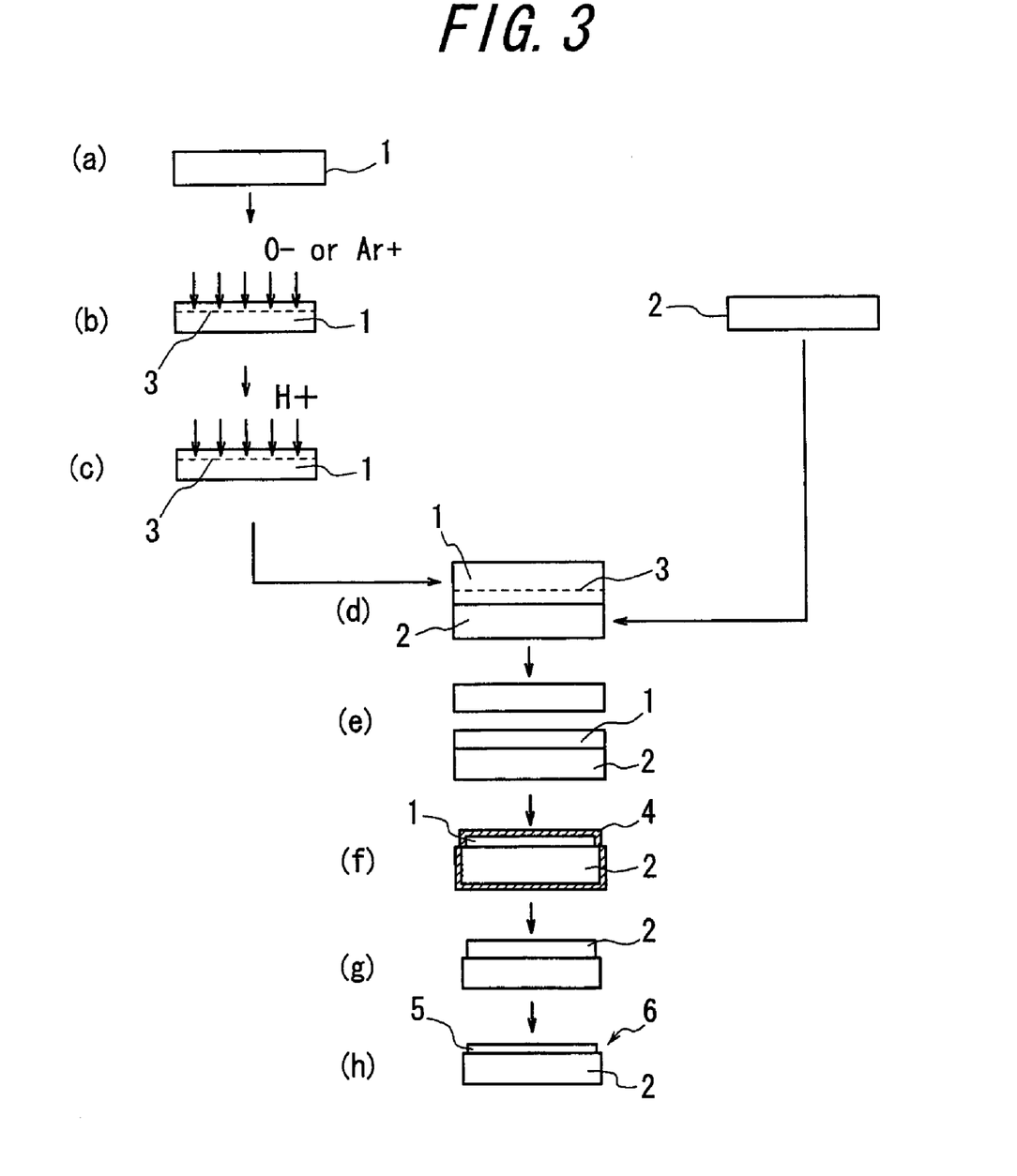
FIG. 3 is a flow chart showing procedures of producing a semiconductor substrate according to the invention.

In the method according to the second invention shown in FIG. 3, a wafer 1 for an active layer and a wafer 2 for a support substrate are previously provided (step (a)). Firstly, ions other than hydrogen such as oxygen ions or argon ions are implanted into the wafer 1 for the active layer up to a position shallower than an exfoliation region of the wafer 1 for the active layer without forming an oxide film (step (b)). Thereafter, hydrogen ions are implanted into the exfoliation region to form a hydrogen ion implanted layer 3 (step (c)).

Then, the wafer 1 for the active layer is laminated at the ion implanted side to the wafer 2 for the support substrate (step (d)), and an exfoliation heat treatment is applied to partly exfoliate the wafer 1 for the active layer at the ion implanted layer 3 as a cleavage plane (exfoliation face) (step (e)), and thereafter the re-oxidation treatment (step (f)), removal of oxide film 4 (step (g)) and planarization treatment (step (h)) are carried out to produce a semiconductor substrate 6 in which a silicon layer 5 is formed on the wafer 2 for the support substrate.

In the above method, the ions other than hydrogen are particularly implanted at the step (b), so that the diffusion of hydrogen into the laminated interface at the exfoliation heat treatment of the step (e) is suppressed by such implanted ions to suppress the occurrence of voids or blisters, and hence the semiconductor substrate is obtained by directly laminating silicon wafers to each other without using the oxide film.

Even in the method of FIG. 3, it is preferable to conduct the implantation of argon ions or oxygen ions in the same manner as in the method of FIG. 2.

Figure 4:
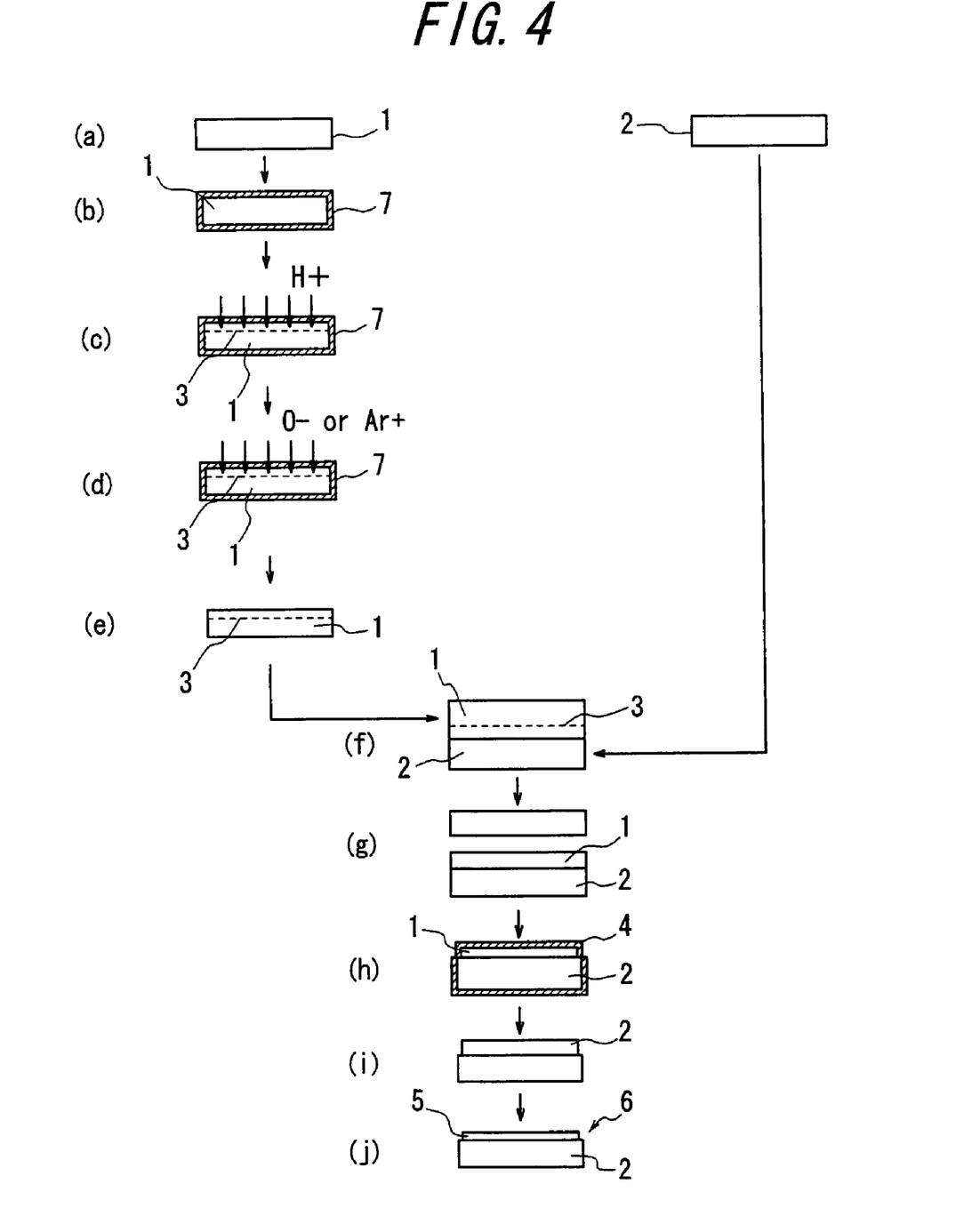
FIG. 4 is a flow chart showing procedures of producing a semiconductor substrate according to the invention.

In the method according to the third invention shown in FIG. 4, a wafer 1 for an active layer and a wafer 2 for a support substrate are previously provided (step (a)). Firstly, an oxide film 7 is formed on the wafer 1 for the active layer (step (b)), and hydrogen ions are implanted into the wafer 1 for the active layer to form an ion implanted layer 3 in the interior of the wafer 1 for the active layer (step (c)).

Thereafter, ions other than hydrogen such as oxygen ions or argon ions are implanted up to a position that a depth from the surface side the hydrogen ion implantation is shallower than the hydrogen ion implanted layer 3 (step (d)). By the implantation of the oxygen ions or argon ions are implanted a dose of ions and oxygen sufficient to suppress the occurrence of void or blister defects in the active layer by such ions themselves and oxygen sputtered by such ions.

Then, the oxide film 7 is completely removed by using a chemical polishing treatment with an etching solution composed mainly of, for example, hydrofluoric acid (hereinafter referred to as HF treatment) (step (e)), and the wafer 1 for the active layer is laminated at the ion implanted side to the wafer 2 for the support substrate (step (f)), and an exfoliation heat treatment is applied to partly exfoliate the wafer 1 for the active layer at the ion implanted layer 3 as a cleavage plane (exfoliation face) (step (g)), and thereafter the re-oxidation treatment (step (h)), removal of oxide film 4 (step (i)) and planarization treatment (step (j)) are carried out to produce a semiconductor substrate 6 in which a silicon layer 5 is formed on the wafer 2 for the support substrate.

In the above method, the ions other than hydrogen are particularly implanted at the step (d) in addition to the hydrogen ion implantation of the preceding step, so that the diffusion of hydrogen into the laminated interface at the exfoliation heat treatment of the step (e) is suppressed by such implanted ions and oxygen sufficiently sputtered at these steps to suppress the occurrence of voids or blisters, and hence the semiconductor substrate is obtained by directly laminating silicon wafers to each other without using the oxide film.

Here, there is explained the condition for sputtering oxygen from the oxide film through the implantation of oxygen ions or argon ions in addition to the implantation of hydrogen ions to implant oxygen required for the suppression of void or blister defects in the active layer is explained in detail below.

Now, in order that ND defined in the equation (I) satisfies $N_D > 4.2 \times 10^{14}$ atoms/cm$^2$ by implanting ions other than hydrogen, it is required to make up a shortfall of $N_{HO}$ (oxygen introduced into the active layer by hydrogen ion implantation) with $N_{IO}$ (oxygen introduced into the active layer by an element other than hydrogen) and $N_{ID}$ (defect introduced into the active layer by implanting ions other than hydrogen).

Figure 5:
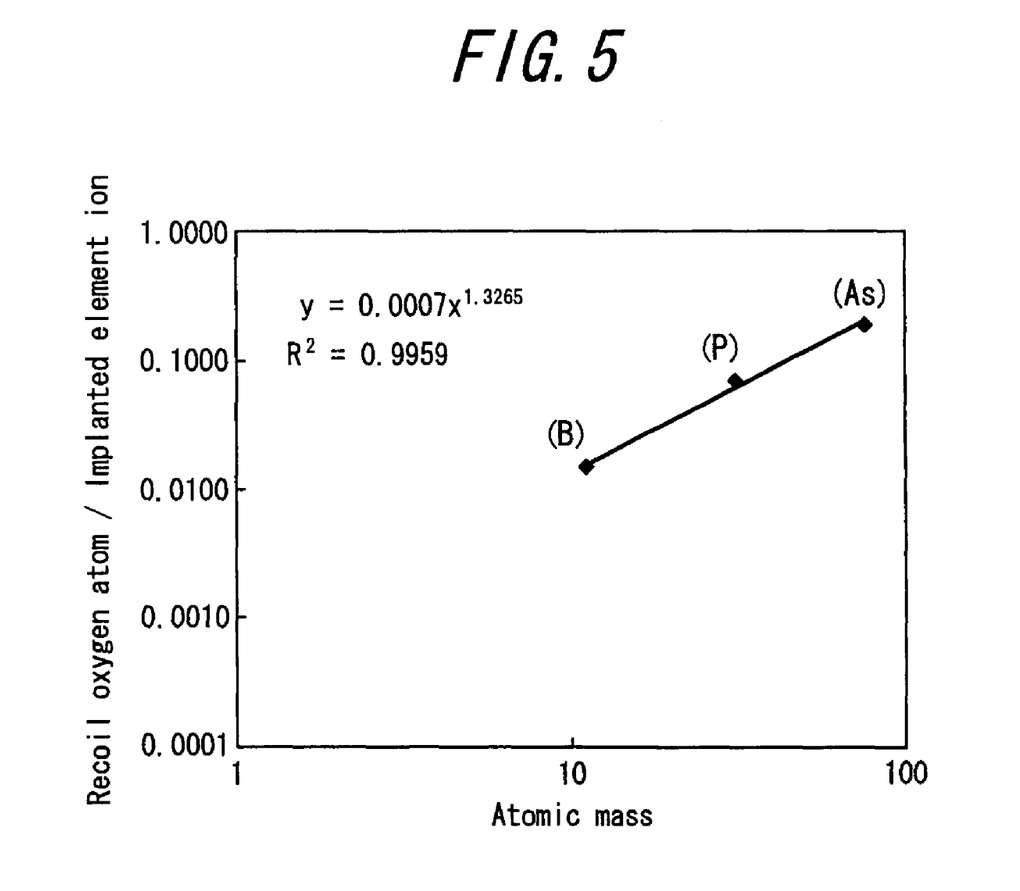
FIG. 5 is a graph showing a relation between atomic mass of each element and a ratio of oxygen atom recoiled in the element implantation to the each element ion.

There are B, P and As as an element generally implanted into the wafer. In Table 1 is shown a dose of oxygen introduced by a recoil phenomenon in the implantation of such an element ion, i.e. a recoil phenomenon that when the element ion is implanted through the oxide film, oxygen atom is sputtered from the oxide film by the implanted ion to strike into Si crystal. In FIG. 5 are shown results arranged as a relation between atomic mass of each element and a ratio of oxygen atom recoiled in the implantation of the element to the element ion (recoil ratio). From the results of FIG. 5, a recoil ratio $R_Z$ of a certain element can be represented by the following equation (III):

$$R_Z = 0.0007 \times q_z^{1.325} \qquad (III)$$

where $q_z$ is an atomic mass.

TABLE 1

Thickness of oxide film: 1 nm, Ion dose: $1.00 \times 10^{13}$ atoms/cm²

| Element | Atomic mass | Recoiled oxygen atom/implanted element ion | Oxygen concentration at interface of Si/SiO₂: B |
|---|---|---|---|
| B | 11 | 0.0150 | $1.50 \times 10^{18}$ |
| P | 31 | 0.0680 | $6.80 \times 10^{18}$ |
| As | 75 | 0.1900 | $1.90 \times 10^{18}$ |

Each recoil ratio of hydrogen, oxygen and argon is determined according to the equation (III) as follows:

Hydrogen: $R_H = 0.0007$ ($q_H = 1$)
Oxygen: $R_O = 0.0277$ ($q_O = 16$)
Argon: $R_{Ar} = 0.0934$ ($q_{Ar} = 40$)

When argon ions are implanted after the hydrogen ion implantation at hydrogen dose: $6 \times 10^{16}$ atoms/cm² and implantation energy: 50 keV, a relation between implantation dose of argon ions and thickness of oxide film is determined in order that $N_D$ defined in the equation (I) satisfies $N_D > 4.2 \times 10^{14}$ atoms/cm².

At first, the equation (I) in the implantation of argon ions is represented as follows:

$$N_D = N_{HO} + N_{ArO} + N_{ArD} \quad (I)$$

When $N_{HO}$, $N_{ArO}$ and $N_{ArD}$ are $$N_{HO} = D_H(\text{hydrogen dose}) \times t_{box}(\text{thickness of oxide film}) \times k_{HO}(\text{coefficient}) \quad (II)$$

(where $D_H = 6 \times 10^{16}$ atoms/cm² and $k_{HO} = 4.76 \times 10^2$ 8/cm)),
$N_{ArO} = D_{Ar}$(argon dose)$\times t_{box}$(thickness of oxide film)$\times k_{ArO}$ (coefficient)
(where $k_{ArO} = R_{Ar}/R_H \times k_{HO} = 0.0934/0.000 \times 4.67 \times 10^2 = 6.23 \times 10^4$) and $N_{ArD} = D_{Ar}$, the above equation (I) is $N_D = N_{HO} + N_{ArO} + N_{ArD} = D_H \times t_{box} \times k_{HO} + D_{Ar} \times t_{box} \times k_{ArO} + D_{Ar} = 4.2 \times 10^{14}$ atoms/cm², from which the implantation dose of argon ions is $D_{Ar} = (4.2 \times 10^{14} - 6.0 \times 10^{16} \times t_{box} \times 4.67 \times 10^2)/(t_{box} \times 6.23 \times 10^4 + 1)$.

Similarly, when oxygen ions are implanted after the hydrogen ion implantation at hydrogen dose: $6 \times 10^{16}$ atoms/cm² and implantation energy: 50 keV, a relation between implantation dose of oxygen ions and thickness of oxide film is determined in order that $N_D$ defined in the equation (I) satisfies $N_D > 4.2 \times 10^{14}$ atoms/cm².

At first, the equation (I) in the implantation of oxygen ions is represented as follows:

$$N_D = N_{HO} + N_{OO} + N_{OD} \quad (I)$$

When $N_{HO}$, $N_{OO}$ and $N_{OD}$ are $$N_{HO} = D_H(\text{hydrogen dose}) \times t_{box}(\text{thickness of oxide film}) \times k_{HO}(\text{coefficient}) \quad (II)$$

(where $D_H = 6 \times 10^{16}$ atoms/cm² and $k_{HO} = 4.76 \times 10^2$ (/cm)),
$N_{OO} = D_O$ (oxygen dose)$\times t_{box}$ (thickness of oxide film)$\times k_{OO}$ (coefficient)
(where $k_{OO} = R_O/R_H \times k_{HO} = 0.0277/0.0007 \times 4.67 \times 10^2 = 1.85 \times 10^4$) and $N_{OD} = D_O$, the above equation (I) is $N_D = N_{HO} + N_{OO} + N_{OD} = D_H \times t_{box} \times k_{HO} + D_O \times t_{box} \times k_{OO} + D_O = 4.2 \times 10^{14}$ atoms/cm², from which the implantation dose of oxygen ions is $D_O = (4.2 \times 10^{14} - 6.0 \times 10^{16} \times t_{box} \times 4.67 \times 10^2)/(t_{box} \times 1.85 \times 10^4 + 1)$.

Figure 6:
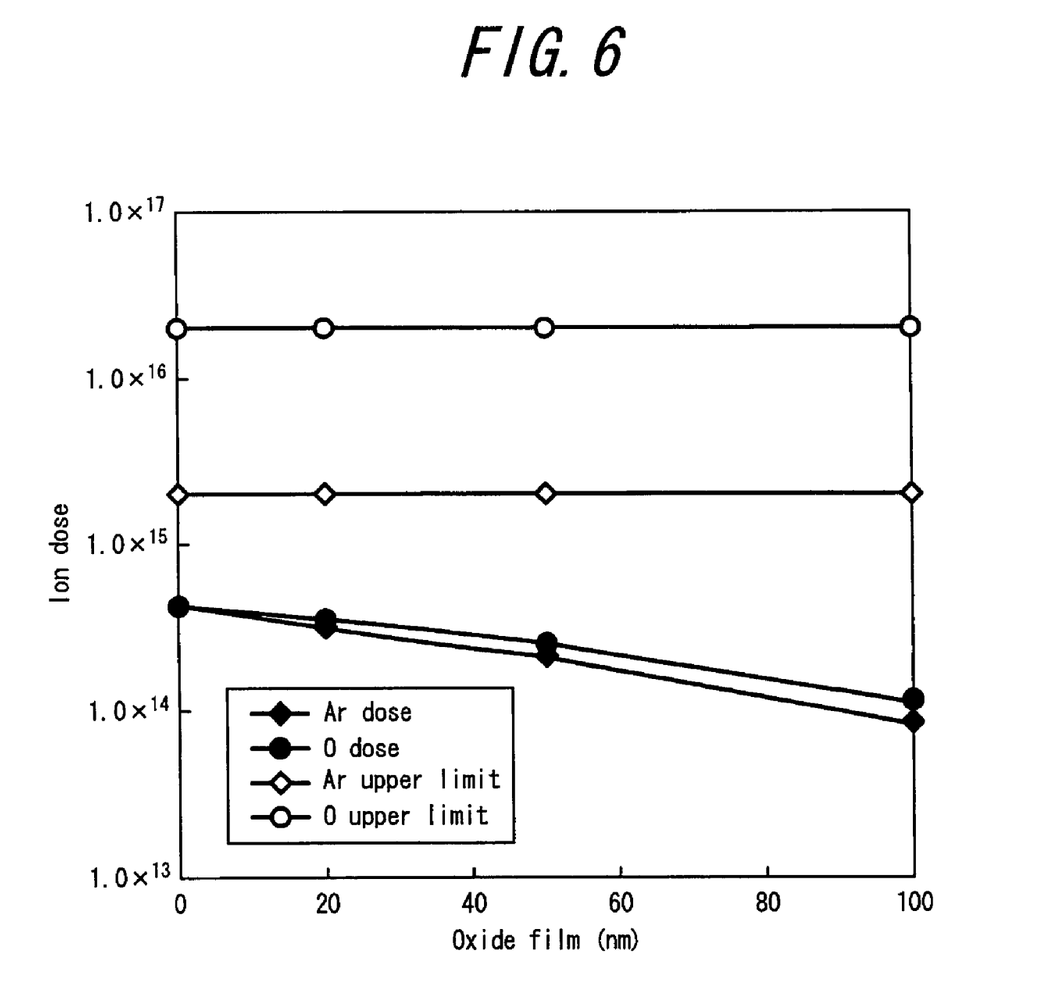
FIG. 6 is a graph showing adequate implantation doses of argon ions and oxygen ions.

In FIG. 6 are shown results obtained by arranging the above adequate implantation doses of argon ions and oxygen ions by the thickness of the oxide film. Moreover, the upper limit on the implantation doses of argon ions and oxygen ions in FIG. 6 is set due to the fact that though defects are introduced into the active layer by implanting the argon ions and oxygen ions, if the implantation dose is too large, the crystallinity of the active layer is broken and the good active layer is not obtained. The upper limit is experimentally $1 \times 10^{16}$ atoms/cm² in case of the argon ions and $2 \times 10^{16}$ atoms/cm² in case of the oxygen ions, respectively.

Figure 7:
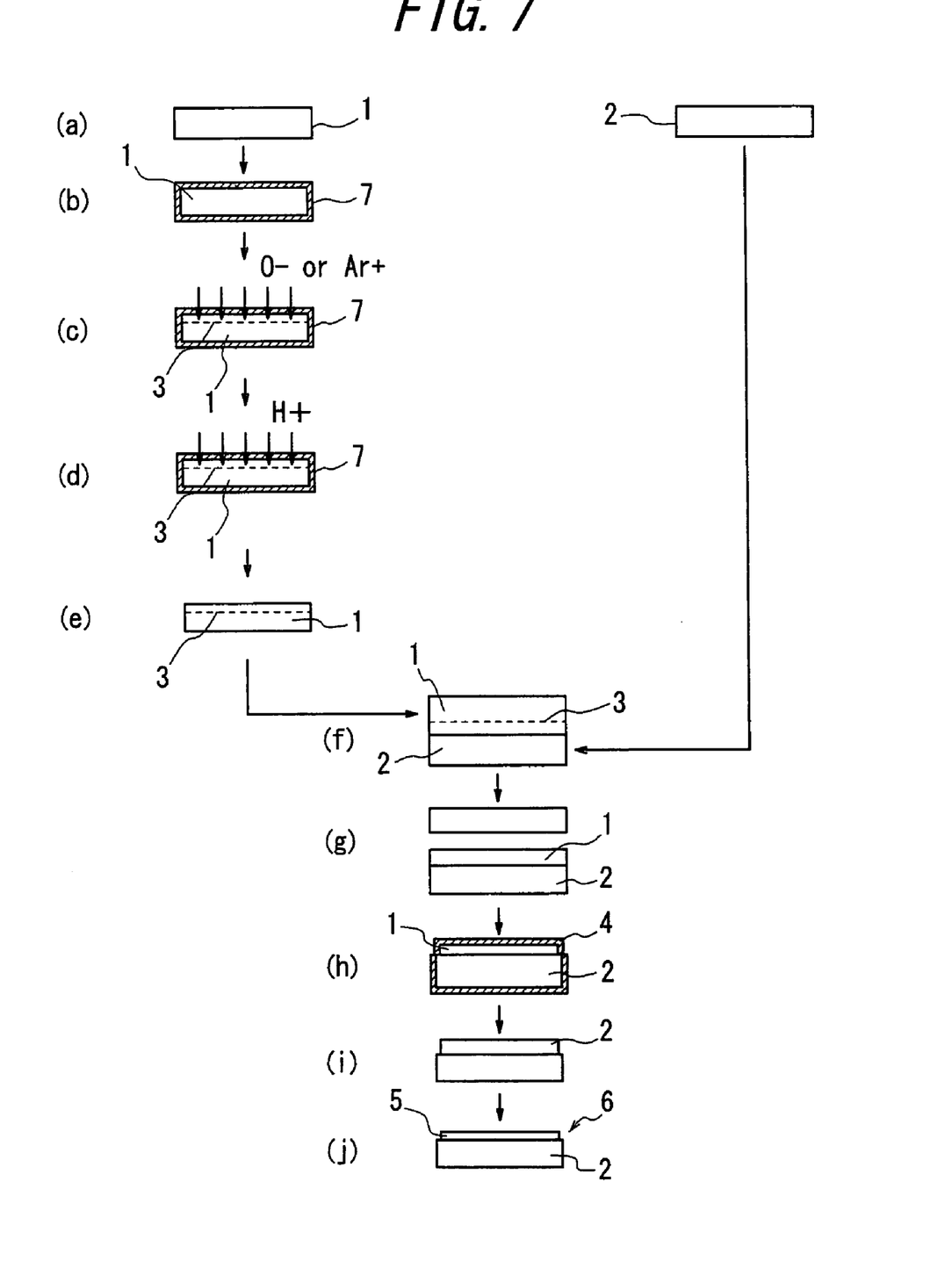
FIG. 7 is a flow chart showing procedures of producing a semiconductor substrate according to the invention.

In the method according to the fourth invention shown in FIG. 7, a wafer 1 for an active layer and a wafer 2 for a support substrate are previously provided (step (a)). Firstly, an oxide film 7 is formed on the wafer 1 for the active layer (step (b)), and ions other than hydrogen such as oxygen ions or argon ions are implanted into the wafer 1 for the active layer up to a position shallower than an exfoliation region of the wafer 1 for the active layer (step (c)). Thereafter, hydrogen ions are implanted into the exfoliation region to form a hydrogen ion implanted layer 3 (step (d)).

Then, the oxide film 7 is completely removed by using, for example, HF treatment (step (e)), and the wafer 1 for the active layer is laminated at the ion implanted side to the wafer 2 for the support substrate (step (f)), and an exfoliation heat treatment is applied to partly exfoliate the wafer 1 for the active layer at the ion implanted layer 3 as a cleavage plane (exfoliation face) (step (g)), and thereafter the re-oxidation treatment (step (h)), removal of oxide film 4 (step (i)) and planarization treatment (step j)) are carried out to produce a semiconductor substrate 6 in which a silicon layer 5 is formed on the wafer 2 for the support substrate.

In the above method, the ions other than hydrogen are particularly implanted at the step (c) in addition to the hydrogen ion implantation of the subsequent step, so that the diffusion of hydrogen into the laminated interface at the exfoliation heat treatment of the step (e) is suppressed by such implanted ions and oxygen sufficiently sputtered at these steps to suppress the occurrence of voids or blisters, and hence the semiconductor substrate is obtained by directly laminating silicon wafers to each other without using the oxide film.

Even in the method shown in FIG. 7, it is preferable to conduct the implantation of argon ions or oxygen ions within the preferable range shown in FIG. 6.

In any methods shown in FIGS. 2, 3, 4 and 7, it is preferable to conduct the plasma treatment for increasing the adhesion strength at the laminated interface prior to the lamination between the wafer for the active layer and the wafer for the support substrate. Since the plasma treatment has effects of activating the laminated surface and removing organic substance adhered to the surface, the adhesion strength of the laminated interface is improved to bring about the decrease of voids or blisters. Moreover, the conditions of the plasma treatment are not particularly limited, but the similar effects can be typically developed by treating the wafers in a gas of oxygen, nitrogen, hydrogen or the like for several tens seconds.

COMPARATIVE EXAMPLE 1

A laminated semiconductor substrate is prepared by forming an oxide film of 150 nm in thickness on the surface of the wafer for the active layer and implanting hydrogen ions so as to come a peak of the implantation dose (ion implanted layer) to a depth position of 500 nm from the surface of the wafer for the active layer, and then laminating the wafer for the active layer at its ion implanted side to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

COMPARATIVE EXAMPLE 2

A laminated semiconductor substrate is prepared by implanting hydrogen ions so as to come a peak of the implantation dose (ion implanted layer) to a depth position of 500 nm from the surface of the wafer for the active layer without forming an oxide film on the surface of the wafer for the active layer as shown in FIG. 1, and laminating the wafer for the active layer at its ion implanted side to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

COMPARATIVE EXAMPLE 1

A laminated semiconductor substrate is prepared by implanting hydrogen ions so as to come a peak of the implantation dose (ion implanted layer) to a depth position of 500 nm from the surface of the wafer for the active layer without forming an oxide film on the surface of the wafer for the active layer as shown in FIG. 1, and then subjecting the surfaces of the wafer for the active layer and the wafer for the support substrate to an oxygen plasma treatment and laminating the wafer for the active layer at its ion implanted side to the wafer for the support substrate and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 1

According to the method shown in FIG. 2, a laminated semiconductor substrate is prepared by implanting hydrogen ions so as to come a peak of the implantation dose (ion implanted layer) to a depth position of 500 nm from the surface of the wafer for the active layer without forming an oxide film on the surface of the wafer for the active layer, and further implanting oxygen ions so as to come a peak of the implantation dose to a depth position of 50 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 2

According to the method shown in FIG. 3, a laminated semiconductor substrate is prepared by implanting oxygen ions so as to come a peak of the implantation dose to a depth position of 50 nm from the surface of the wafer for the active layer without forming an oxide film on the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 3

According to the method shown in FIG. 2, a laminated semiconductor substrate is prepared by implanting hydrogen ions so as to come a peak of the implantation dose (ion implanted layer) to a depth position of 500 nm from the surface of the wafer for the active layer without forming an oxide film on the surface of the wafer for the active layer, and further implanting argon ions so as to come a peak of the implantation dose to a depth position of 50 nm from the surface of the wafer for the active layer, and laminating the wafer for the active layer at its ion implanted side to the wafer for the support substrate after the implantation of both the ions, and conducting the exfoliation heat treatment to and thereafter conducting an oxidation treatment and removing the oxide film and exfoliate the wafer for the active layer at the hydrogen ion implanted peak region (ion implanted layer), conducting the planarization treatment.

INVENTION EXAMPLE 4

According to the method shown in FIG. 3, a laminated semiconductor substrate is prepared by implanting argon ions so as to come a peak of the implantation dose to a depth position of 50 nm from the surface of the wafer for the active layer without forming an oxide film on the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 5

According to the method shown in FIG. 4, a laminated semiconductor substrate is prepared by forming an oxide film of 20 nm on the wafer for the active layer, implanting hydrogen ions so as to come a peak of the implantation dose (ion implanted layer) to a depth position of 500 nm from the surface of the wafer for the active layer, and further implanting oxygen ions so as to come a peak of the implantation dose to a depth position of 50 nm from the surface of the wafer for the active layer, and then completely removing the oxide film through HF treatment, and laminating the wafer for the active layer at its ion implanted side to the wafer for the support substrate, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 6

According to the method shown in FIG. 4, a laminated semiconductor substrate is prepared by forming an oxide film of 20 nm on the wafer for the active layer, implanting oxygen ions so as to come a peak of the implantation dose to a depth position of 50 nm from the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 7

According to the method shown in FIG. 4, a laminated semiconductor substrate is prepared by forming an oxide film of 20 nm on the wafer for the active layer, implanting hydrogen ions so as to come a peak of the implantation dose (ion implanted layer) to a depth position of 500 nm from the surface of the wafer for the active layer, and further implanting argon ions so as to come a peak of the implantation dose to a depth position of 50 nm from the surface of the wafer for the active layer, and then completely removing the oxide film through HF treatment, and laminating the wafer for the active layer at its ion implanted side to the wafer for the support substrate, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 8

According to the method shown in FIG. 7, a laminated semiconductor substrate is prepared by forming an oxide film of 20 nm on the wafer for the active layer, implanting argon ions so as to come a peak of the implantation dose to a depth position of 50 nm from the surface of the wafer for the active layer, and further implanting hydrogen ions so as to come a peak of the implantation dose (ion implanted layer) to a depth position of 500 nm from the surface of the wafer for the active layer, and laminating the wafer for the active layer at its ion implanted side to the wafer for the support substrate after the implantation of both the ions, and conducting the exfoliation heat treatment to exfoliate the wafer for the active layer at the hydrogen ion implanted peak region (ion implanted layer), and thereafter conducting an oxidation treatment and removing the oxide film and conducting the planarization treatment.

INVENTION EXAMPLE 9-16

In these examples, the same procedures as in Invention Examples 1-8 are repeated, respectively, except that the surfaces of the wafer for the active layer and the wafer for the support substrate are subjected to an oxygen plasma treatment prior to the lamination between the wafer for the active layer and the wafer for the support substrate. Moreover, the plasma treatment is carried out under condition that the wafers are kept for 20 seconds after the interior of the reaction chamber replaced with oxygen gas is rendered into a vacuum state.

In the above examples, the ion implantation conditions are as follows.

Hydrogen dose: $6.0 \times 10^{16}$ atoms/cm$^2$ and implantation energy: 50 keV Oxygen dose: $1.0 \times 10^{16}$ atoms/cm$^2$ and implantation energy: 50 keV Argon dose: $1.0 \times 10^{16}$ atoms/cm$^2$ and implantation energy: 80 keV With respect to the thus obtained semiconductor substrates, the quantity of defects generated is visually measured as a count of defect number under a high-intensity light-gathering lamp or a fluorescent lamp. The results are shown in Table 2. As seen from Table 2, the occurrence of defects is suppressed in the semiconductor substrates according to the invention even when the oxide film is not existent.

TABLE 2

|  | Thickness of oxide film (nm) | Ion implantation 1 | Ion implantation 2 | Plasma treatment | Defect number (defects/300 mm wafer) |
|---|---|---|---|---|---|
| Comparative Example 1 | 150 | H | — | — | not more than 2 |
| Comparative Example 2 | — | H | — | — | 50 |
| Comparative Example 3 | — | H | — | ○ | 30 |
| Invention Example 1 | — | H | O | — | not more than 20 |
| Invention Example 2 | — | O | H | — | not more than 10 |
| Invention Example 3 | — | H | Ar | — | not more than 15 |
| Invention Example 4 | — | Ar | H | — | not more than 5 |
| Invention Example 5 | 20 | H | O | — | not more than 10 |
| Invention Example 6 | 20 | O | H | — | not more than 2 |
| Invention Example 7 | 20 | H | Ar | — | not more than 10 |
| Invention Example 8 | 20 | Ar | H | — | not more than 2 |
| Invention Example 9 | — | H | O | ○ | not more than 10 |

TABLE 2-continued

| | Thickness of oxide film (nm) | Ion implantation 1 | Ion implantation 2 | Plasma treatment | Defect number (defects/300 mm wafer) |
|---|---|---|---|---|---|
| Invention Example 10 | — | O | H | ◯ | not more than 5 |
| Invention Example 11 | — | H | Ar | ◯ | not more than 10 |
| Invention Example 12 | — | Ar | H | ◯ | not more than 2 |
| Invention Example 13 | 20 | H | O | ◯ | not more than 5 |
| Invention Example 14 | 20 | O | H | ◯ | not more than 1 |
| Invention Example 15 | 20 | H | Ar | ◯ | not more than 5 |
| Invention Example 16 | 20 | Ar | H | ◯ | not more than 1 |

As shown in Table 2, when hydrogen ions are first implanted, the organic substance existing on the surface of the wafer is easily adhered onto the wafer and the blisters are easily generated. Therefore, it is preferable to first implant ions other than hydrogen, and it is more preferable to clean the wafer after the implantation of ions other than hydrogen and then implant hydrogen ions.

What is claimed is:

1. A method for producing a semiconductor substrate, which comprises the steps of:
    implanting oxygen ions into a wafer for an active layer having no oxide film on its surface up to a position shallower than an exfoliation region of the wafer for the active layer, from an ion implanted side,
    implanting hydrogen ions into the exfoliation region to form a hydrogen ion implanted layer,
    laminating the wafer for the active layer at the ion implanted side to a wafer for a support substrate, and then
    exfoliating the wafer for the active layer at the hydrogen ion implanted layer;
    wherein ($D_O$): implantation dose of oxygen ions, such that $4.2*10^{14}$ atoms/cm$^2$<$D_O$<$2*10^{16}$ atoms/cm$^2$.

2. A method for producing a semiconductor substrate, which comprises the steps of:
    forming an oxide film on a wafer for an active layer,
    implanting oxygen ions into a wafer for the active layer on its surface up to a position shallower than an exfoliation region of the wafer for the active layer, to sputter a first quantity of oxygen ($N_{IO}$) from the oxide film;
    implanting hydrogen ions into the exfoliation region to form a hydrogen ion implanted layer, and sputter a second quantity of oxygen($N_{HO}$) from the oxide film;
    removing the oxide film from the wafer for the active layer,
    laminating the wafer for the active layer at the ion implanted side to a wafer for a support substrate, and then
    exfoliating the wafer for the active layer at the hydrogen ion implanted layer;
    wherein the first quantity of oxygen and the second quantity of oxygen are determined in consideration of a total factor number producing an effect of suppressing hydrogen diffusion ($N_D$) expressed by formula (I) and $N_{ID}$ below:

$$N_D = N_{HO} + N_{IO} + N_{ID} \quad (I)$$

wherein $N_D$: total factor number producing an effect of suppressing hydrogen diffusion;
$N_{HO}$: oxygen introduced into active layer through hydrogen ion implantation;
$N_{IO}$: oxygen introduced into active layer through ion implantation other than hydrogen;
$N_{ID}$: defects introduced into active layer through ion implantation other than hydrogen;
and wherein $N_D > 4.2*10^{14}$ atoms/cm$^2$.

3. A method for producing a semiconductor substrate according to claim 1 or claim 2, wherein a plasma treatment is carried out prior to the lamination of the wafer for the active layer and the wafer for the support substrate.

* * * * *